(12) United States Patent  
Wang et al.

(10) Patent No.: US 12,538,614 B2  
(45) Date of Patent: Jan. 27, 2026

(54) LIGHT-EMITTING DEVICE AND MANUFACTURING METHOD FOR MAKING THE SAME

(71) Applicant: Anhui San'an Optoelectronics Co., Ltd., Wuhu (CN)

(72) Inventors: Yu Wang, Wuhu (CN); Xiulei Shi, Wuhu (CN); Doudou Zhao, Wuhu (CN); Yao Li, Wuhu (CN); Cheng-Hung Lee, Wuhu (CN); Chan-Chan Ling, Wuhu (CN)

(73) Assignee: Anhui San'an Optoelectronics Co., Ltd., Wuhu (CN)

( * ) Notice: Subject to any disclaimer, the term of this patent is extended or adjusted under 35 U.S.C. 154(b) by 425 days.

(21) Appl. No.: 18/178,297

(22) Filed: Mar. 3, 2023

(65) Prior Publication Data

US 2023/0420611 A1    Dec. 28, 2023

(30) Foreign Application Priority Data

Jun. 24, 2022   (CN) .......................... 202210722495.3

(51) Int. Cl.
  *H10H 20/815*  (2025.01)
  *H10H 20/01*   (2025.01)
  *H10H 20/825*  (2025.01)

(52) U.S. Cl.
  CPC .... *H10H 20/815* (2025.01); *H10H 20/01335* (2025.01); *H10H 20/825* (2025.01)

(58) Field of Classification Search
  None
  See application file for complete search history.

(56) References Cited

U.S. PATENT DOCUMENTS

| | | | |
|---|---|---|---|
| 8,263,988 B2 * | 9/2012 | Basceri | H01L 21/0254 257/94 |
| 2011/0012109 A1 * | 1/2011 | Kryliouk | H01L 21/0237 257/E29.168 |

* cited by examiner

*Primary Examiner* — Bradley Smith  
(74) *Attorney, Agent, or Firm* — MUNCY, GEISSLER, OLDS & LOWE, P.C.

(57) ABSTRACT

A light-emitting device includes a patterned substrate, a buffer layer, an epitaxial layered unit, and at least one hole structure. The patterned substrate includes a supporting substrate having an upper surface, and a plurality of protrusions formed on the upper surface. Each of the protrusions includes a base and a cone sequentially stacked in such order on the upper surface. The cone is made of a material different from that of the supporting substrate. The buffer layer formed on a side wall surface of each of the protrusions and the upper surface of the supporting substrate exposed from the protrusions. The epitaxial layered unit is formed on the buffer layer opposite to the patterned substrate. The hole structure is disposed above a top end of at least one of the protrusions. A method for manufacturing the light-emitting device is also disclosed.

10 Claims, 4 Drawing Sheets

LIGHT-EMITTING DEVICE AND MANUFACTURING METHOD FOR MAKING THE SAME

CROSS-REFERENCE TO RELATED APPLICATION

This application claims priority to Chinese Invention Patent Application No. 202210722495.3, filed on Jun. 24, 2022.

FIELD

The disclosure relates to a semiconductor device, and more particularly to a light-emitting device and a manufacturing method of making the same.

BACKGROUND

Patterned sapphire substrate is the mainstream substrate used for light-emitting diode (LED) chips. The patterned sapphire substrate may relieve stress between a sapphire substrate and a GaN epitaxial layer during growth of the GaN epitaxial layer, reduce the defect density in the GaN epitaxial layer, improve the lattice quality of an epitaxial material, and enhance the light extraction efficiency.

To enhance the light extraction efficiency of the sapphire substrate, a common method involves forming a structure of a plurality of cone-shaped protrusions on the sapphire substrate. Another method is to use a substrate 9 including a plurality of SiO$_2$ portions 91 (one of which is shown) and a sapphire portion 92, such as shown in FIG. 1. Although such substrate 9 combined of SiO$_2$ and sapphire may improve the light-emitting efficiency, but defects 94 (one of which is shown) in a longitudinal direction are likely to occur at a top of each of the protrusions 93 (including one of the SiO$_2$ portions 91 and a part of the sapphire portion 92), and such defects in the longitudinal direction may further extend to an active layer (not shown) during epitaxial growth. Defects in the active layer may easily lead to an electron-hole capture, such that electrons and holes may not recombine and radiate, and hence affect the light-emitting efficiency.

Therefore, the defects need to be avoided during epitaxial growth so as to enhance the light-emitting efficiency of the LED.

SUMMARY

Therefore, an object of the disclosure is to provide a light-emitting device and a method for manufacturing the same that can alleviate at least one of the drawbacks of the prior art.

According to an aspect of the disclosure, a light-emitting device includes a patterned substrate, a plurality of protrusions, a buffer layer, an epitaxial layered unit, and at least one hole structure. The patterned substrate includes a supporting substrate having an upper surface. The protrusions are formed on the upper surface of the supporting substrate. Each of the protrusions has a top end and includes a base and a cone sequentially stacked in such order on the upper surface of the supporting substrate. The cone is made of a material different from that of the supporting substrate. The buffer layer is formed on a side wall surface of each of the protrusions and the upper surface of the supporting substrate exposed from the protrusions. The epitaxial layered unit is formed on the buffer layer opposite to the patterned substrate. The at least one hole structure is disposed above the top end of at least one of the protrusions. The at least one hole structure is located at a top of the cone of the at least one of the protrusions and extend into the epitaxial layered unit.

According to another aspect of the disclosure, a method for manufacturing a light-emitting device includes the steps of: S1) forming a dielectric layer on a supporting layer; S2) removing a part of the dielectric layer (102) and a part of an upper region of the supporting layer by etching so as to form the supporting layer and the dielectric layer into a patterned substrate that has a supporting substrate and a plurality of protrusions formed on the supporting substrate, each of the protrusions having a top end and including a base and a cone sequentially stacked in such order on an upper surface of the supporting substrate, the cone being made of a material different from that of the supporting substrate; S3) forming a buffer layer on a side wall surface of each of the protrusions and the upper surface of the supporting substrate exposed from the protrusions; and S4) forming an epitaxial layered unit on the buffer layer, at least one hole structure being formed above the top end of at least one of the protrusions during forming of the epitaxial layered unit.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
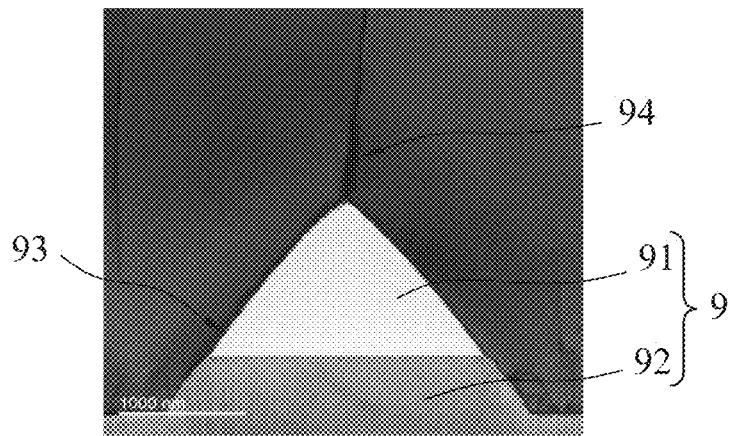
FIG. 1 is an electron microscope photograph of an epitaxial layer with defects in a longitudinal direction according to the prior art.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper,"

"lower," "on," "above," "over," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

The inventors of this disclosure noticed that a substrate made of only sapphire with a structure of protrusions generally adopts lateral epitaxy technique to improve the lattice quality. That is to say, an epitaxial layer is directly grown on a side wall surface of each of the protrusions, which will generate insertions in a lateral direction. These insertions in the lateral direction will be canceled out by insertions in the longitudinal direction generated by a bottom surface of the sapphire substrate, thereby preventing defects from occurring. However, for the sapphire substrate having upper portions of the protrusions made of $SiO_2$, due to epitaxial growth of the epitaxial layer on $SiO_2$ being difficult to perform, the epitaxial layer is mainly grown from a side wall surface and the bottom surface of the sapphire substrate. Therefore, the epitaxial growth of the epitaxial layer in the lateral direction is lessened, and eventually defects 94 in the longitudinal direction are likely to occur at a top of each of the protrusions 93 as shown in FIG. 1. As such, the inventors of this disclosure propose a light-emitting device in which at least one hole structure is disposed above a top of at least one of the protrusions. The at least one hole structure may alleviate a stress at a position where portions of an epitaxial layered unit are merged above the top of the at least one of the protrusions, thereby alleviating or eliminating the defects in the longitudinal direction and improving the light emitting efficiency of the light-emitting device of this disclosure.

According to an aspect of the disclosure, a method for manufacturing a light-emitting device is provided and includes the following steps.

Figure 2:
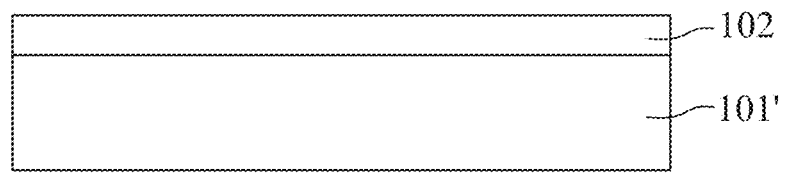
FIG. 2 is a schematic view illustrating a dielectric layer being disposed on a supporting layer according to the disclosure.

Referring to FIG. 2, in step S1, a dielectric layer 102 is formed on a supporting layer 101' using a suitable depositing process.

Figure 3:
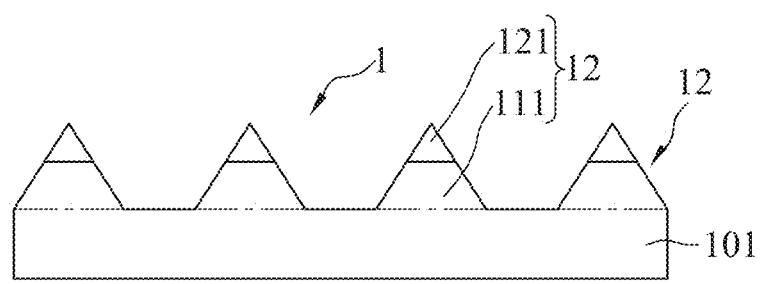
FIG. 3 is a schematic view illustrating a plurality of protrusions being formed according to the disclosure.

In step S2, referring to FIG. 3, a part of the dielectric layer 102 and a part of an upper region of the supporting layer 101' shown in FIG. 2 are removed by etching so as to form the supporting layer 101' and the dielectric layer 102 into a patterned substrate 1 that has a supporting substrate 101 and a plurality of protrusions 12 formed on the supporting substrate 101. Each of the protrusions 12 has a top end and includes a base 111 and a cone 121 sequentially stacked in such order on an upper surface of the supporting substrate 101. The cone 121 is made of a material different from that of the supporting substrate 101. In some embodiments, the cone 121 may have a circular base or a polygonal base.

Figure 4:
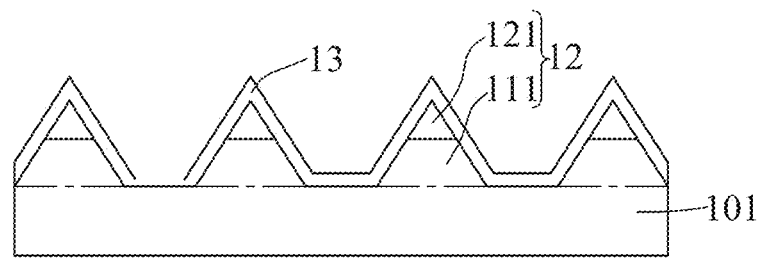
FIG. 4 is a schematic view illustrating a buffer layer being formed according to the disclosure.

In step S3, referring to FIG. 4, a buffer layer 13 is formed on a side wall surface of each of the protrusions 12 so as to cover each of the protrusions 12 in entirety, and the upper surface of the supporting substrate 101 exposed from the protrusions 12.

Figure 5:
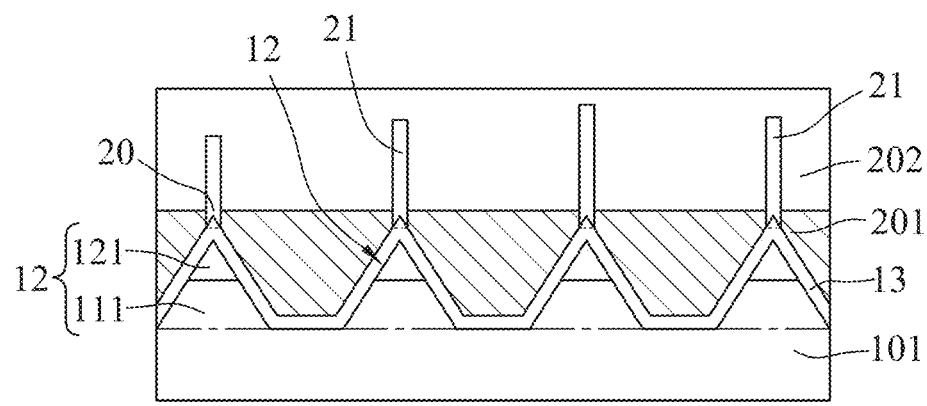
FIG. 5 is a schematic view illustrating a plurality of hole structures being formed according to the disclosure.
Figure 6:
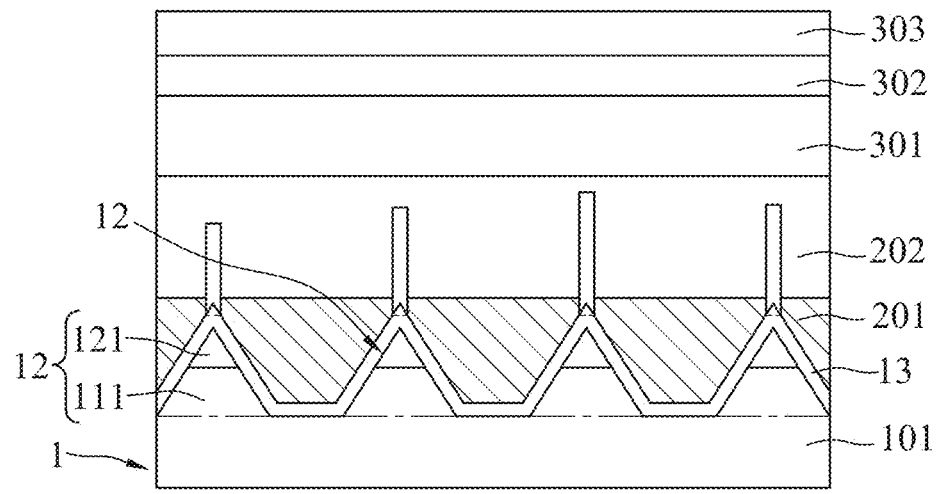
FIG. 6 is a schematic view illustrating a first semiconductor layer, an active layer, and a second semiconductor layer being formed according to the disclosure.

In step S4, referring to FIGS. 5 and 6, an epitaxial layered unit is formed on the buffer layer 13, and at least one hole structure 21 is formed above the top end of at least one of the protrusions 12 during forming of the epitaxial layered unit.

Specifically, in step S2, the cones 121 of the protrusions 12 are obtained by partially removing the dielectric layer 102, and the bases 111 of the protrusions 12 are obtained by partially removing the upper region of the supporting layer 101'. The material of the base 111 is identical to that of the supporting substrate 101. In each of the protrusions 12, the cone 121 is located on the base 111. Each of the protrusions 12 may have a shape of a spherical cap, a cone having a circular base, or a cone having a polygonal base (i.e., a pyramid). The protrusions 12 may be of the same shape or different shapes, and may be randomly or periodically arranged. In addition, a spacing between two adjacent ones of the protrusions 12 is not limited and may be determined by actual requirements.

Furthermore, in step S4, the epitaxial layered unit has a refractive index that is greater than a refractive index of the supporting substrate 101, and the refractive index of the supporting substrate 101 is greater than a refractive index of the cone 121.

Specifically, in step S2, the supporting substrate 101 may be made of one of sapphire, SiC, Si, ZnO, and combinations thereof. In this embodiment, the supporting substrate 101 is made of sapphire. The cone 121 may be made of one of sapphire, SiC, Si, ZnO, $SiO_2$, SiN, SiO, and combinations thereof. In this embodiment, the cone 121 is made of $SiO_2$. The supporting substrate 101 is made of a material different from that of the cone 121. It should be noted that, the cones 121 of the protrusions 12 are obtained by partially removing the dielectric layer 102, and therefore the cones 121 of this embodiment are made of a material identical to that of the dielectric layer 102.

In this embodiment, the supporting substrate 101 is made of sapphire, and the cone 121 is made of $SiO_2$. The silica ($SiO_2$) material has a refractive index of approximately 1.45, and the sapphire material has a refractive index of approximately 1.78. For the epitaxial layered unit that is mainly made of GaN, a difference in refractive index between silica and GaN is even greater (a GaN material has a refractive index of approximately 2.5), so after light emitted from the epitaxial layered unit reaches the patterned substrate 1, the light is more likely to be completely reflected. Compared to a supporting substrate that is only made of sapphire, in the present disclosure, the supporting substrate 101 having the cones 121 of the protrusions 12 may better enhance the light-emitting efficiency of the light-emitting device.

Furthermore, in step S3, the buffer layer 13 may be made of one of AlN, AlGaN, AlInGaN, and combinations thereof. In some embodiments, the buffer layer 13 is made of AlN. The buffer layer 13 may be deposited by metal organic chemical vapor deposition (MOCVD) or physical vapor deposition (PVD) technique. The buffer layer 13 may improve lattice mismatch between the supporting substrate 101 and the epitaxial layered unit. For example, when the supporting substrate 101 and the epitaxial layered unit are made of sapphire and GaN, respectively, the buffer layer 13 may reduce the stress caused by lattice mismatch between sapphire and GaN, thereby improving the quality of epitaxial growth, obtaining a better surface in terms of achieving surface uniformity of the epitaxial layered unit, and improving the light-emitting efficiency.

In addition, in step S4, the epitaxial layered unit includes a first growth layer 201 and a second growth layer 202 sequentially stacked in such order on the buffer layer 13. The first growth layer 201 has an upper surface that is higher than the top end of each of the protrusions 12, and the at least one hole structure 21 extends into the second growth layer 202.

Specifically, formation of the at least one hole structure 21 starts from the forming of the first growth layer 201.

Furthermore, in step S4, during the forming of the first growth layer 201 by epitaxial technique, by controlling a lateral growth rate of the first growth layer 201, a concave hole 20 is formed in the first growth layer 201 and above the top end of the at least one of the protrusions 12. During forming of the second growth layer 202 by epitaxy technique, the at least one hole structure 21 is formed from the concave hole 20. In details, the concave hole 20 in the first growth layer 201 may serve as a lower part of the at least one hole structure 21, and a portion of the at least one hole structure 21, which is formed in the second growth layer 202, may serve as an upper part of the at least one hole structure 21.

Figure 7:
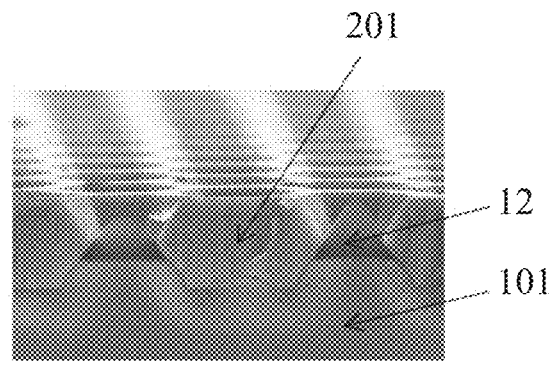
FIG. 7 is an electron microscope photograph of a first growth layer being formed according to the disclosure.
Figure 8:
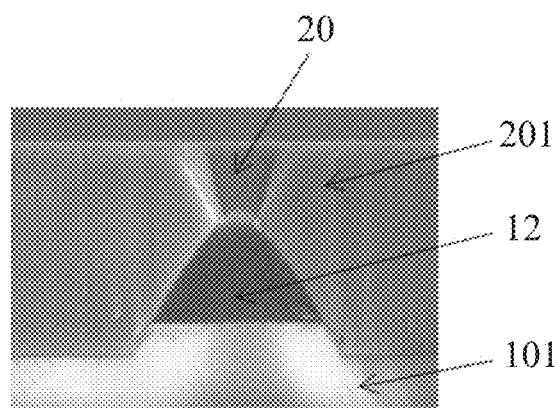
FIG. 8 is an electron microscope photograph of a concave hole formed above a top end of one of the protrusions during forming of the first growth layer according to the disclosure.

Specifically, when forming the first growth layer 201 by epitaxy technique, epitaxial growth on a side wall surface of the cone 121 may be difficult to perform. By adjusting parameters for the epitaxial growth (i.e., adjusting a rate and a duration for both longitudinal growth and lateral growth), the hole structure 21 may be formed. When growing the first growth layer 201, the first growth layer 201 above the top end of each of the protrusions 12 is prevented from growing in the longitudinal direction so as to form the concave hole 20. Then, the concave hole 20 is elongated and finally enclosed by controlling growth of the second growth layer 202 in a lateral direction so as to eventually form the hole structure 21. At the same time, due to atom migration, it may be difficult for atoms to be attached to the top end of each of the protrusions 12, which also explains why the at least one hole structure 21 is formed. In addition, referring to FIGS. 7 and 8, the upper surface of the first growth layer 201 is higher than the top end of each of the protrusions 12 so as to fill gaps among the protrusions 12 and to form the concave hole 20 above the top end of the at least one of the protrusions 12, thereby forming into the hole structure 21 during a subsequent growth process. The first growth layer 201 and the second growth layer 202 may be made of GaN materials, but is not limited to. In some other embodiments, the first growth layer 201 and the second growth layer 202 may be made GaN, GaP, AlGaInP, or other suitable materials for forming the hole structure 21.

In step S2, each of the protrusions 12 has a height ranging from 1.7 μm to 2.2 μm, and the first growth layer 201 has a maximum thickness ranging from 2 μm to 3 μm. In step S4, the forming of the first growth layer 201 is conducted by growing the first growth layer 201 under a growth temperature ranging from 950° C. to 1080° C., in a reaction chamber having a pressure ranging from 100 Torr to 300 Torr (e.g., 150 Torr), and at a molar ratio of a group V semiconductor material to a group III semiconductor material ranging from 800 to 1000.

The second growth layer 202 has a thickness ranging from 1.5 μm to 2 μm. In step S4, the forming of the second growth layer 202 is conducted by growing the second growth layer 202 under a growth temperature ranging from 1080° C. to 1140° C., in a reaction chamber having a pressure ranging from 100 Torr to 300 Torr (e.g., 150 Torr), and at a molar ratio of a group V semiconductor material (e.g., nitrogen-contained semiconductor material) to a group III semiconductor material (e.g., gallium-contained semiconductor material) ranging from 1000 to 1200.

Figure 9:
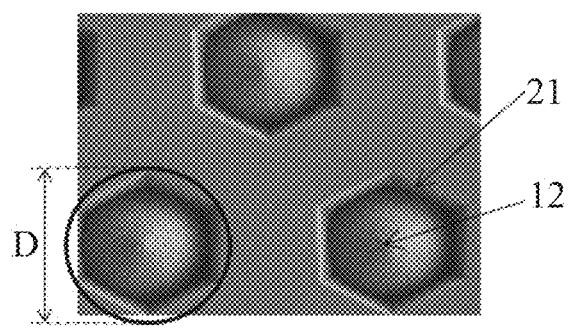
FIG. 9 is a top-view electron micrograph of the hole structures and the protrusions according to the disclosure.

The at least one hole structure 21 is a hexagonal prism, and the hexagonal prism has a cross section parallel to the upper surface of the supporting substrate 101. Referring to FIG. 9, the cross section of the hexagonal prism has an outer circumcircle having a diameter (D) that ranges from 0.1 μm to 0.5 μm. In some embodiments, the at least one hole structure 21 is a hollow hexagonal prism. The diameter (D) of the outer circumcircle may be adjusted by adjusting the thickness of the first growth layer 201. Considering the cost and the quality of materials, a large diameter (D) may result in the thickness of the first growth layer 201 being too great, and therefore wasting time and affecting the quality of materials. On another hand, a small diameter (D) may lead to the hole structure 21 being ineffective. As a result, based on actual testing results, the diameter (D) of the outer circumcircle that ranges from 0.1 μm to 0.5 μm in cross section is workable for forming hole structure 21. The hole structure 21 has a height that is usually within 1 μm, but is not limited to.

It should be noted that FIG. 9 is an enlarged top view of the first growth layer 201 and the second growth layer 202 at an initial growth stage, i.e., an initial growth stage of the at least one hole structure 21. A final and fully formed hole structure 12 is not as large as it appears in FIG. 9.

The hole structure 21 is vacuumed or filled with a gas during epitaxial growth, and the gas is one of $NH_3$, inert gas (e.g., $N_2$ and other suitable inert gas, such as helium (He), neon (Ne), argon (Ar), krypton (Kr), xenon (Xe) or the like, may also be used), and a combination thereof.

Figure 10:
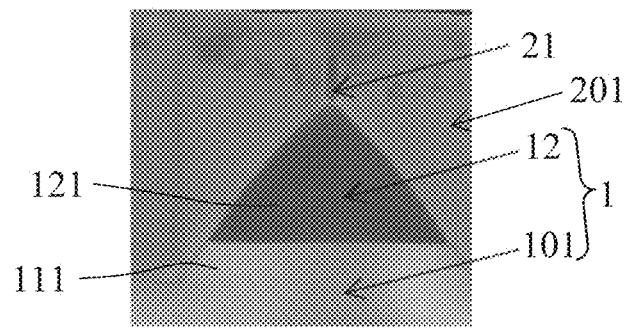
FIGS. 10-11 illustrate electron micrographs of a hole structure according to the disclosure.
Figure 11:
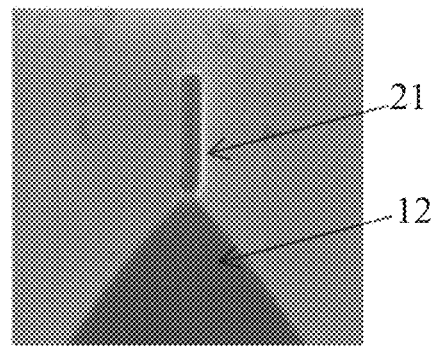
Figure 12:
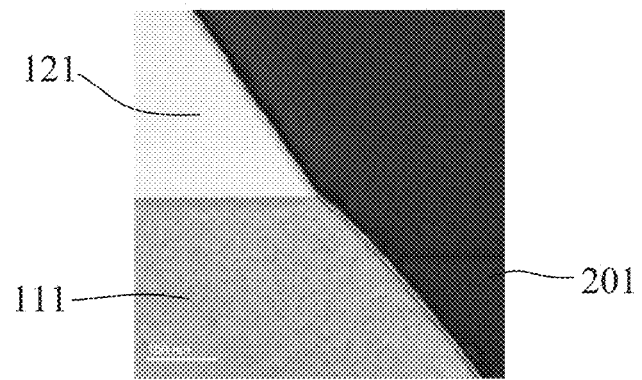
FIG. 12 is an electric micrograph illustrating a portion of one of the protrusions according to the disclosure.

Referring to FIGS. 10 and 11, a shape of the at least one hole structure 21 is shown. The at least one hole structure 21 effectively reduces stress at top of the patterned substrate 1 where the epitaxial layered unit contacts each of the protrusions 12 at the side wall surface thereof, thereby preventing the defects in the longitudinal direction, reducing the defects in an active layer 302 (see FIG. 6), and improving the internal quantum efficiency. At the same time, because the hole structure 21 is vacuumed or filled with a gas, the hole structure 21 has a refractive index of approximately 1. Therefore, compared to the cone 121 that is made of silica or the supporting substrate 101 that is made of sapphire, a difference between the hole structure 21 and the epitaxial layered unit in terms of refractive index is even greater. Therefore, the light emitted from the epitaxial layered unit to an interface where the hole structure 21 and the epitaxial layered unit meet is more likely to be completely reflected, thus enhancing the light-emitting efficiency.

Referring to FIG. 6, the epitaxial layered unit includes a first semiconductor layer 301, the active layer 302, and a second semiconductor layer 303 that are sequentially disposed on the buffer layer 13. In some embodiments, the first semiconductor layer 301, the active layer 302, and the second semiconductor layer 303 are sequentially disposed on the second growth layer 202. The second semiconductor layer 303 has a conductivity type that is opposite to that of the first semiconductor layer 301. In some embodiments, a plurality of the hole structures 21 are formed respectively above the top ends of the protrusions 12. The hole structures 21 may have the same height or different heights.

Specifically, the first semiconductor layer 301 and the second semiconductor layer 303 have different conductivity types and may be n-typed or p-typed. For example, when the first semiconductor layer 301 is n-typed, the second semiconductor layer 303 is p-typed, and vice versa. The active layer 302 is a light-emitting layer where the recombination of the electrons and the holes occurs, and may be a single quantum well or multiple quantum wells. The active layer 302 may emit red light, green light, blue light, and other lights.

According to another aspect of the disclosure, referring to FIGS. 6 to 12, a light-emitting device is provided and includes the patterned substrate 1, the buffer layer 13, the epitaxial layered unit, and the at least one hole structure 21. The patterned substrate 1 includes the supporting substrate 101 having the upper surface, and the plurality of protrusions 12 formed on the upper surface of the supporting substrate 101. Each of the protrusions 12 has the top end and includes the base 111 and the cone 121 sequentially stacked in such order on the upper surface of the supporting substrate 101. The cone 121 is made of a material different from that of the supporting substrate 101.

The buffer layer 13 that is formed on the side wall surface of each of the protrusions 12 and the upper surface of the supporting substrate 101 exposed from the protrusions 12.

Furthermore, the epitaxial layered unit is formed on the buffer layer 13 opposite to the patterned substrate 1, and the at least one hole structure 21 is disposed above the top end of the at least one of the protrusions 12. The at least one hole structure 21 is located at a top of the cone 121 of the at least one of the protrusions 12 and extends into the epitaxial layered unit. That is to say, the at least one hole structure 21 is located opposite to the supporting substrate 101.

Specifically, the bases 111 of the protrusions 12 are obtained by partially removing the upper region of the supporting layer 101' shown in FIG. 2, and thus the bases 111 are made of a material identical to that of the supporting substrate 101. In each of the protrusions 121, the cone 121 is located on the base 111. Each of the protrusions 12 may have a shape of a spherical cap, a cone having a circular base, or a cone having a polygonal base (i.e., a pyramid). The protrusions 12 may be of the same shape or different shapes, and may be randomly or periodically arranged. In addition, a spacing between two adjacent ones of the protrusions 12 is not limited and may be determined by actual requirements.

Furthermore, the refractive index of the epitaxial layered unit is greater than the refractive index of the supporting substrate 101, and the refractive index of the supporting substrate 101 is greater than the refractive index of the cone 121.

Specifically, the supporting substrate 101 may be made of one of sapphire, SiC, Si, ZnO, and combinations thereof. In this embodiment, the supporting substrate 101 is made of sapphire. The cone 121 may be made of one of sapphire, SiC, Si, ZnO, $SiO_2$, SiN, SiO, and combinations thereof. In this embodiment, the cone 121 is made of $SiO_2$. The material of the supporting substrate 101 is different from that of the cone 121

In this embodiment, the supporting substrate 101 is made of sapphire, and the cone 121 is made of $SiO_2$. The refractive index of the silica material ($SiO_2$) is approximately 1.45, and the refractive index of the sapphire material is approximately 1.78. For the epitaxial layered unit that is mainly made of GaN, the difference in refractive index between silica and GaN is even greater (the refractive index of the GaN material is approximately 2.5), so after the light emitted from the epitaxial layered unit reaches the patterned substrate 1, the light is more likely to be completely reflected. Compared to the supporting substrate that is only made of sapphire, in the present disclosure, the supporting substrate 101 having the cones 121 of the protrusions 12 may better enhance the light-emitting efficiency of the light-emitting device.

Furthermore, the buffer layer 13 may be made of one of AlN, AlGaN, AlInGaN, and combinations thereof. In some embodiments, the buffer layer 13 is made of AlN. The buffer layer 13 may be deposited by MOCVD or PVD technique. The buffer layer 13 may improve the lattice mismatch between the supporting substrate 101 and the epitaxial layered unit. For example, when the supporting substrate 101 and the epitaxial layered unit are made of sapphire and GaN, respectively, the buffer layer 13 may reduce stress caused by the lattice mismatch between sapphire and GaN, thereby improving the quality of epitaxial growth, obtaining a better surface in terms of achieving surface uniformity of the epitaxial layered unit, and improving the light-emitting efficiency.

In addition, the epitaxial layered unit includes the first growth layer 201 and the second growth layer 202 sequentially stacked in such order on the buffer layer 13. The upper surface of the first growth layer 201 is higher than the top end of each of the protrusions 12, and the at least one hole structure 21 extends into the second growth layer 202. The height of each of the protrusions 12 ranges from 1.7 µm to 2.2 µm. The maximum thickness of the first growth layer 201 ranges from 2 µm to 3 µm, and the thickness of the second growth layer 202 ranges from 1.5 µm to 2 µm.

Specifically, the formation of the at least one hole structure 21 starts from the forming of the first growth layer 201. Details on the forming of the at least one hole structure 21 may be referred to the previous aspect of the disclosure.

Furthermore, the epitaxial layered unit includes the first semiconductor layer 301, the active layer 302, and the second semiconductor layer 303 that are sequentially disposed on the buffer layer 13. In some embodiments, the first semiconductor layer 301, the active layer 302, and the second semiconductor layer 303 are sequentially disposed on the second growth layer 202. The conductivity type of the second semiconductor layer 303 is opposite to that of the first semiconductor layer 301. In some embodiments, the plurality of the hole structures 21 are formed respectively above the top ends of the protrusions 12. The hole structures 21 may have the same height or different heights.

Specifically, the first semiconductor layer 301 and the second semiconductor layer 303 have different conductivity types and may be n-typed or p-typed. For example, when the first semiconductor layer 301 is n-typed, the second semiconductor layer 303 is p-typed, and vice versa. The active layer 302 is a light-emitting layer where recombination of electrons and holes occurs, and may be a single quantum well or multiple quantum wells. The active layer 302 may emit red light, green light, blue light, and other lights.

The at least one hole structure 21 is a hexagonal prism, and the cross section of the hexagonal prism is parallel to the upper surface of the supporting substrate 101. The cross section of the hexagonal prism has an outer circumcircle having a diameter (D) that ranges from 0.1 µm to 0.5 µm. In some embodiments, the at least one hole structure 21 is a hollow hexagonal prism.

The hole structure 21 is vacuumed or filled with a gas during epitaxial growth, and the gas is one of $NH_3$, inert gas (e.g., $N_2$ and other suitable inert gas, such as helium (He), neon (Ne), argon (Ar), krypton (Kr), xenon (Xe) or the like, may also be used), and a combination thereof.

The at least one hole structure 21 effectively reduces the stress at the top of the patterned substrate 1 where the epitaxial layered unit contacts each of the protrusions 12 at the side wall surface thereof, thereby preventing the defects in the longitudinal direction, reducing the defects in the active layer 302 (see FIG. 6), and improving the internal quantum efficiency. At the same time, because the hole structure 21 is vacuumed or filled with a gas, the refractive index of the hole structure 21 is approximately 1. Therefore, compared to the cone 121 that is made of silica or the supporting substrate 101 that is made of sapphire, the difference between the hole structure 21 and the epitaxial layered unit in terms of refractive index is even greater. Therefore, the light emitted from the epitaxial layered unit to the interface where the hole structure 21 and the epitaxial layered unit meet is more likely to be completely reflected, thus enhancing the light-emitting efficiency.

Specifically, the light-emitting device of this disclosure may be obtained by a manufacturing method according to the previous aspect of the disclosure, but is not limited to.

By virtue of the hole structure 21 reducing the defects in the active layer 302 and improving the light-emitting efficiency, the light-emitting device of the disclosure may improve the luminous intensity thereof and increase the level of protection against electrostatic discharge (ESD). After electrodes being made and packaging of the light-emitting device being completed, the luminous intensity of the light-emitting device of the disclosure increased by 0.5% and its level of protection against ESD increased by 0.4% based on tests conducted, thereby offering higher commercial values.

In summary, the light-emitting device and the manufacturing method thereof are provided in this disclosure. The light-emitting device includes the patterned substrate that includes the supporting substrate and the plurality of protrusions. Each of the protrusions has the base and the cone sequentially stacked in such order on the supporting substrate. The cone may facilitate the light-emitting efficiency of the light-emitting device. In addition, by adjusting parameters for epitaxial growth and by forming the hole structure above the top end of each of the protrusions, the stress occurring due to the contact between the epitaxial layered unit and the protrusions may be avoided, thereby avoiding the defects in the longitudinal direction and improving the internal quantum efficiency. Meanwhile, due to the hole structure being vacuumed or filled with a gas, which makes the difference between the refractive index of the hole structure and that of the epitaxial layered unit even greater, a total reflection may easily occur, thereby improving the light-emitting efficiency. Based on the tests conducted on the light-emitting device, the luminous intensity and the level of protection against ESD of the light-emitting device are both improved, hence the light-emitting device offers better commercial values.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, FIGure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is(are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light-emitting device, comprising:
   a patterned substrate that includes a supporting substrate having an upper surface, and a plurality of protrusions formed on said upper surface of said supporting substrate, each of said protrusions having a top end, and including a base and a cone sequentially stacked in such order on said upper surface of said supporting substrate, said cone being made of a material different from that of said supporting substrate;
   a buffer layer that is formed on a side wall surface of each of said protrusions and said upper surface of said supporting substrate exposed from said protrusions;
   an epitaxial layered unit that is formed on said buffer layer opposite to said patterned substrate; and
   at least one hole structure that is disposed above said top end of at least one of said protrusions, said at least one hole structure being located above a top of said cone of said at least one of said protrusions and extending into said epitaxial layered unit.

2. The light-emitting device as claimed in claim 1, wherein said epitaxial layered unit includes a first growth layer and a second growth layer sequentially stacked in such order on said buffer layer, said first growth layer having an upper surface that is higher than said top end of each of said protrusions, said at least one hole structure extending into said second growth layer.

3. The light-emitting device as claimed in claim 2, wherein each of said protrusions has a height ranging from 1.7 µm to 2.2 µm, said first growth layer having a maximum thickness that ranges from 2 µm to 3 µm, said second growth layer having a thickness that ranges from 1.5 µm to 2 µm.

4. The light-emitting device as claimed in claim 1, wherein said base is made of a material identical to that of said supporting substrate.

5. The light-emitting device as claimed in claim 1, wherein a refractive index of said epitaxial layered unit is greater than a refractive index of said supporting substrate, the refractive index of said supporting substrate being greater than a refractive index of said cone.

6. The light-emitting device as claimed in claim 1, wherein said buffer layer is made of one of AlN, AlGaN, AlInGaN, and combinations thereof.

7. The light-emitting device as claimed in claim 1, wherein said supporting substrate is made of one of sapphire, SiC, Si, ZnO, and combinations thereof, said cone being made of one of sapphire, SiC, Si, ZnO, $SiO_2$, SiN, SiO, and combinations thereof.

8. The light-emitting device as claimed in claim 1, wherein said epitaxial layered unit includes a first semiconductor layer, an active layer, and a second semiconductor layer that are sequentially disposed on said buffer layer, said second semiconductor layer having a conductivity type opposite to that of said first semiconductor layer.

9. The light-emitting device as claimed in claim 1, wherein said at least one hole structure is a hollow hexagonal prism, said hollow hexagonal prism having a cross section parallel to said upper surface of said supporting substrate, said cross section of said hollow hexagonal prism having an outer circumcircle that has a diameter ranging from 0.1 µm to 0.5 µm.

10. The light-emitting device as claimed in claim 1, wherein said at least one hole structure is vacuumed or filled with a gas, said gas being one of $NH_3$, inert gas, and a combination thereof.

* * * * *